United States Patent [19]

Blankenship et al.

[11] Patent Number: 5,784,329
[45] Date of Patent: Jul. 21, 1998

[54] LATCHED DRAM WRITE BUS FOR QUICKLY CLEARING DRAM ARRAY WITH MINIMUM POWER USAGE

[75] Inventors: Dennis Blankenship; Tim Lao, both of Durham; Rhonda Cassada, Hillsborough, all of N.C.

[73] Assignee: Mitsubishi Semiconductor America, Inc., Durham, N.C.

[21] Appl. No.: 781,388

[22] Filed: Jan. 13, 1997

[51] Int. Cl.⁶ ............................................. G11C 7/00
[52] U.S. Cl. ............... 365/227; 365/189.05; 365/230.06
[58] Field of Search ............................... 365/226, 227, 365/189.05, 230.06

[56] References Cited

U.S. PATENT DOCUMENTS

| | | | |
|---|---|---|---|
| 4,849,935 | 7/1989 | Miyazawa | 365/189.05 |
| 5,043,944 | 8/1991 | Nakamura et al. | 365/189.05 |
| 5,138,577 | 8/1992 | Oh | 365/189.05 |
| 5,239,506 | 8/1993 | Dachtera et al. | 365/189.05 |
| 5,245,579 | 9/1993 | Ohta | 365/203 |
| 5,305,281 | 4/1994 | Lubeck | 365/230.04 |
| 5,305,283 | 4/1994 | Shimokura et al. | 365/230.08 |
| 5,388,075 | 2/1995 | Vinal | 365/189.05 |
| 5,398,213 | 3/1995 | Yeon et al. | 365/238.5 |
| 5,416,371 | 5/1995 | Katayama et al. | 327/57 |
| 5,426,606 | 6/1995 | Takai | 365/230.06 |
| 5,430,680 | 7/1995 | Parris | 365/222 |

*Primary Examiner*—David C. Nelms
*Assistant Examiner*—Hoai Van Ho
*Attorney, Agent, or Firm*—Lowe, Price, LeBlanc & Becker

[57] ABSTRACT

The power consumed by repetitive switching and precharging of a DRAM bus during repetitive write cycles is reduced by latching the data lines to the DRAM array during repeated data writes in a way which avoids the necessity of precharging the lines before every write. A fast write mode is invoked when repeated writes are to occur and is cleared at the end of the repeated writes.

7 Claims, 10 Drawing Sheets

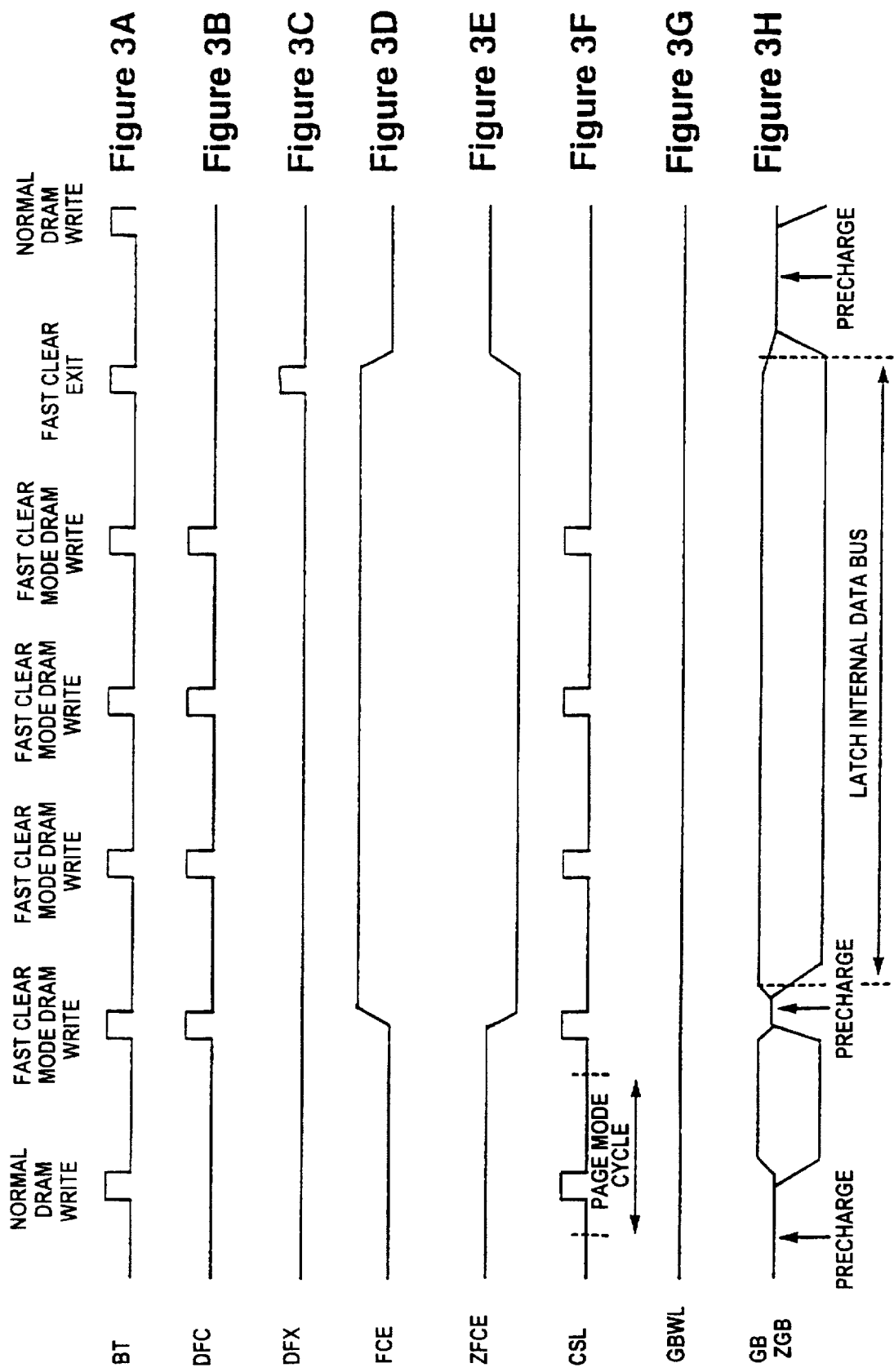

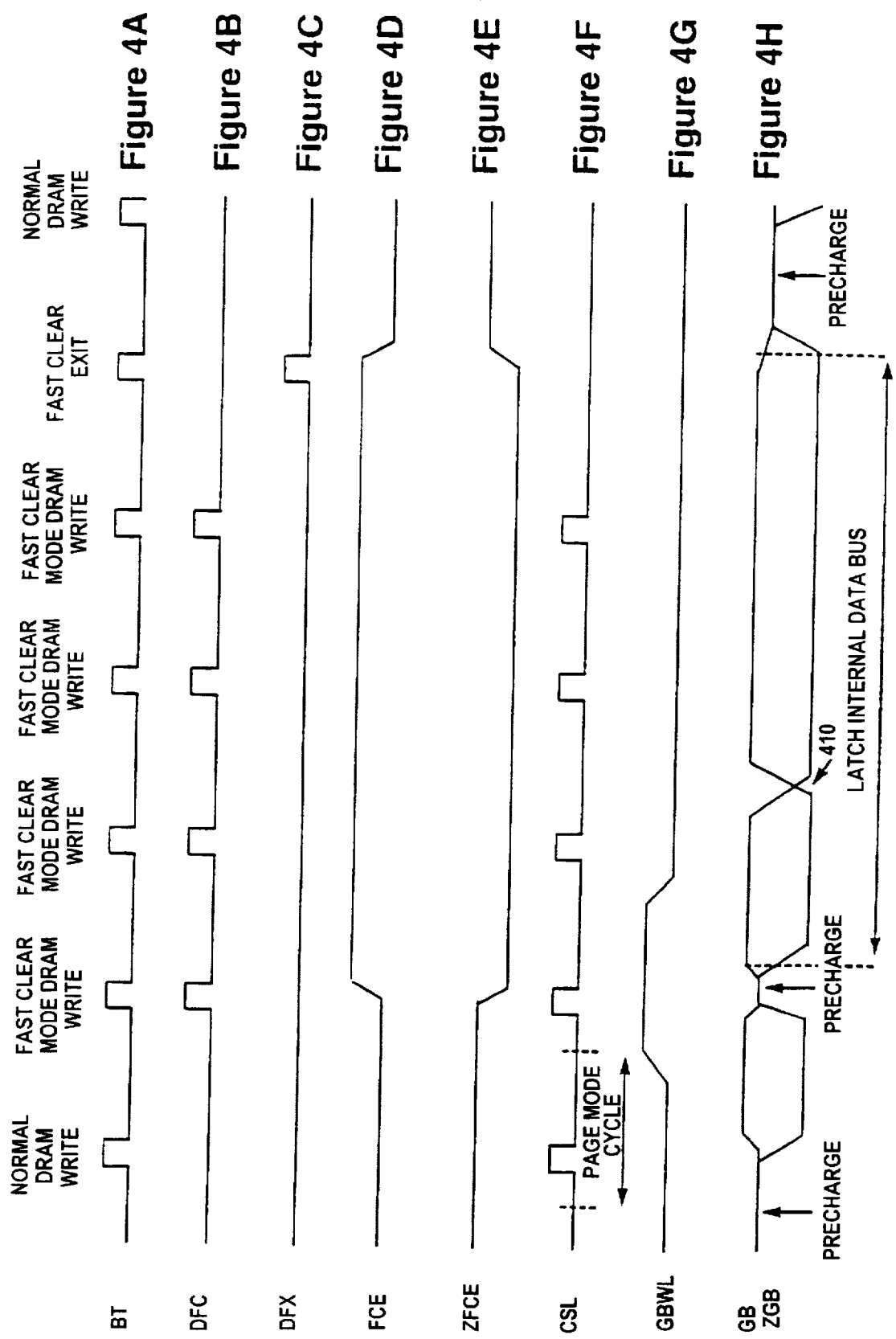

5,784,329

1

LATCHED DRAM WRITE BUS FOR QUICKLY CLEARING DRAM ARRAY WITH MINIMUM POWER USAGE

TECHNICAL FIELD

This invention relates to memory systems and, more particularly, to a DRAM data bus having a latch for quickly writing to a DRAM array with reduced power consumption.

BACKGROUND ART

Memory access to a DRAM array over a memory bus is well-known in the art. In some contexts, a latch circuit has been used in combination with memory arrays. For example, U.S. Pat. No. 5,416,371 to Katayama et al. discloses a DRAM with a latch circuit for reducing power consumption. A downward voltage swing of the lower level bit line BLN is limited by turning off an FET that couples the common node of the latch to the reference voltage when the bit line voltage falls to a predetermined level. U.S. Pat. No. 5,388,075 to Vinal discloses a latch circuit for a high speed, low power RAM. A differential latching inverter (DLI) is connected to a pair of bit lines in a memory array, for sensing the binary state of a memory cell. When one of the input signals to the DLI rises above a predetermined threshold, the DLI is responsive to a small differential component between the signals applied thereto to rapidly latch the output of the inverter to one logical state or another. When the DLI is not being called to read or write, both of the bit lines are placed at ground potential so that both output terminals are at a LOW output state, i.e. at ground. No DC power is dissipated by DLI 10 in any of the three states. Minimal power is dissipated only during the switching interval i.e. when switching from one state to another.

THE PROBLEM

There is a need to reduce DRAM power consumption caused by the switching/precharging of a data bus during repetitive write cycles.

DISCLOSURE OF THE INVENTION

When repetitive writes to DRAM occur, each writing in the same data and operating at minimum DRAM write cycle times, high power consumption occurs. This occurs due to the need in the prior art to drive the data bus to the proper value, write to the DRAM array and then precharge the bus, repeatedly, for each write operation.

Applicants have determined that, particularly when the same data is being written into the DRAM array each time, the precharge operation can be temporarily suspended, therefore reducing the amount of power consumed to write to the DRAM. The method for eliminating the precharge operation involves the addition of a latch to the control circuit of the data path's write driver. The latch, when issued the proper control signals, enters the DRAM Fast Clear Mode and latches the internal data bus (GB/ZGB) to the DRAM array. Once the data bus is latched, word lines may be accessed and precharged, columns may be selected, allowing the latched data to be written to any accessible DRAM location. Reads cannot be performed during the Fast Clear Mode. To return the write operation to normal, an exit command, namely a DRAM Fast Clear Exit (DFX), is issued, which resets the latch. The internal data bus may now be precharged.

The invention is directed to apparatus for reducing power consumption during sequential writes to a DRAM array,

2 including a write driver for writing data to the array, and a data bus write driver control circuit, having a clocked latch, for latching the data state of an incoming line to a value without precharging. The latch may change state when the line changes state. The bus write driver control circuit has a second latch activated by a control input for entering a fast data write state which remains active over a plurality of memory cycles. The second latch has a second control input for resetting the second latch to resume normal memory write operation.

The invention is also directed to a method of reducing power consumption during sequential writes to a DRAM array, by latching the data state of an incoming line to a data value of the line, and performing multiple writes to the DRAM array of the value without precharging between writes.

BRIEF DESCRIPTION OF DRAWINGS

FIGS. 3A–3H are latch timing diagrams showing operation of the circuit shown in FIGS. 2A and 2B.

FIG. 4A–4H are logic timing diagrams showing operation of the circuit shown in FIGS. 2A and 2B when the write data switches from low to high during latched operation.

BEST MODE FOR CARRYING OUT THE INVENTION

Figure 1:
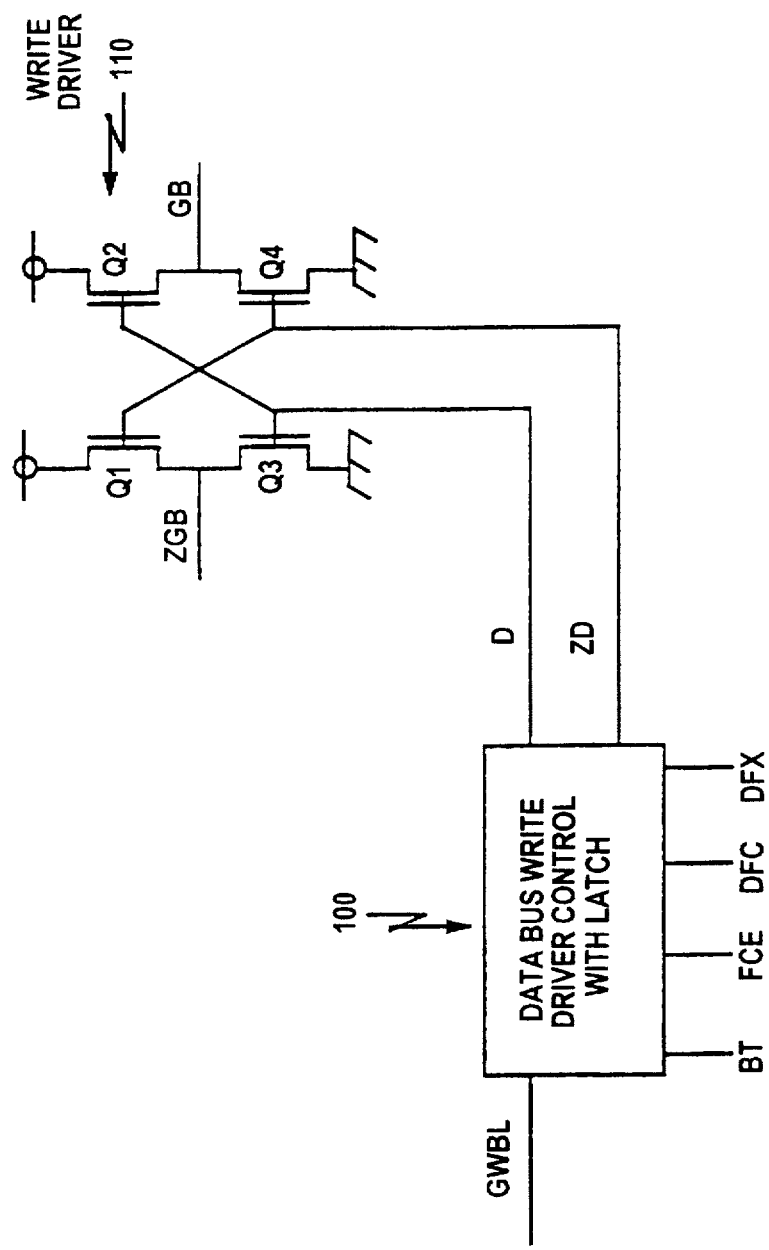
FIG. 1 is a block diagram showing control of a write driver in accordance with the invention.

FIG. 1 is a block diagram showing latching control of a write driver in accordance with the invention. The write driver in question is formed of four transistors Q1, Q2, Q3 and Q4 and driven by lines D and ZD which represent the latched write data. That is, line D is the data and line ZD is generally the inverse of the data as described in the timing diagrams more fully hereinafter. Lines GB and ZGB represent the output lines from the write driver 110, shown in FIG. 1. The Data Bus Write Driver with Latch receives data and control signals as follows. Line GWBL constitutes the write data. Line BT constitutes the data transfer signal line. Line DFC constitutes a latch enable signal to invoke a fast clear mode. Line DFX constitutes a fast clear exit to deselect the latch. This circuit arrangement will be described more hereinafter.

Figure 2A:
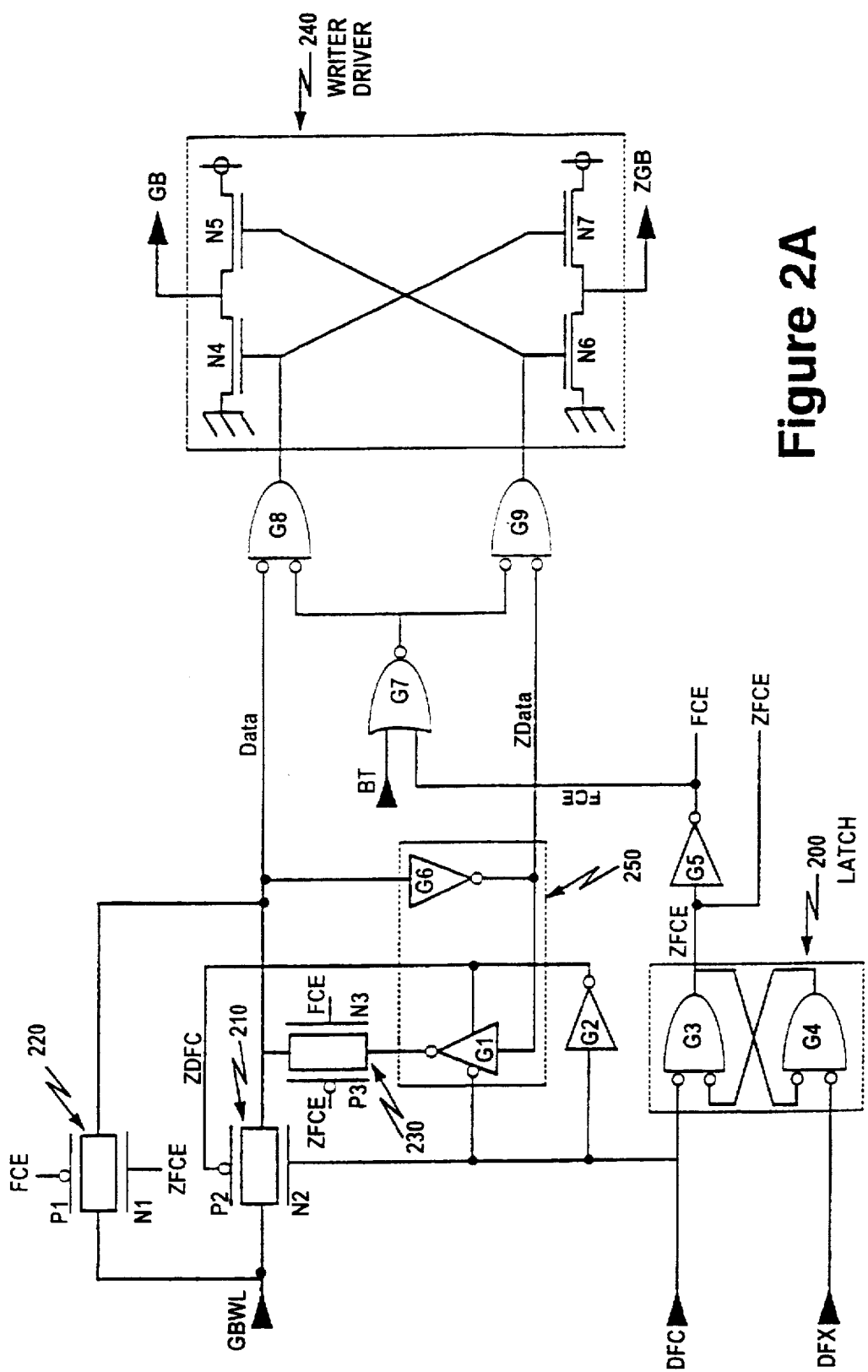
FIG. 2A is a logic diagram of circuitry for implementing the Data Bus Write Driver with Latch of FIG. 1 in accordance with the invention.

As shown in FIG. 2A, gates G3 and G4 constitute a first latch which is set and reset respectively by line DFC and DFX. When line DFC is activated, the latch outputs signal ZFCE to inverter G5 where it becomes line signal FCE for application to NORgate G7. When DFC is active, the signal is also applied to inverter G2 and clocked inverter G1. Clocked inverter G1 and inverter G6 form a data latch, 250, which permits the data state to be held constant when the same value is being repetitively written or to change state under the conditions indicated in the timing diagrams without precharge. DFC is also applied to one input of a PN passgate 210. At input N2, the output of inverter G2 is applied to the other input to PN passgate 210, namely P2. The output of inverter G2 is labeled line ZDFC. Thus, when signal DFC is high, both inputs to PN passgate 210 are in a state to permit data to be passed from the data line GBWL through to one inverted input of gate G8. When the latch 200 is reset, line ZFCE is high and line FCE is low by virtue of the inversion of inverter G5. This permits data coming from line GBWL to be applied to the data line through PNN passgate 220. That data value is then inverted in inverter G6 and applied to the other Z DATA line. Output gates G8 and G9 are clocked by the NORgate G7 when either the FCE signal is high or the input BT is high. This permits the data to be applied in regular and inverted form to write driver 240.

Figure 2B:
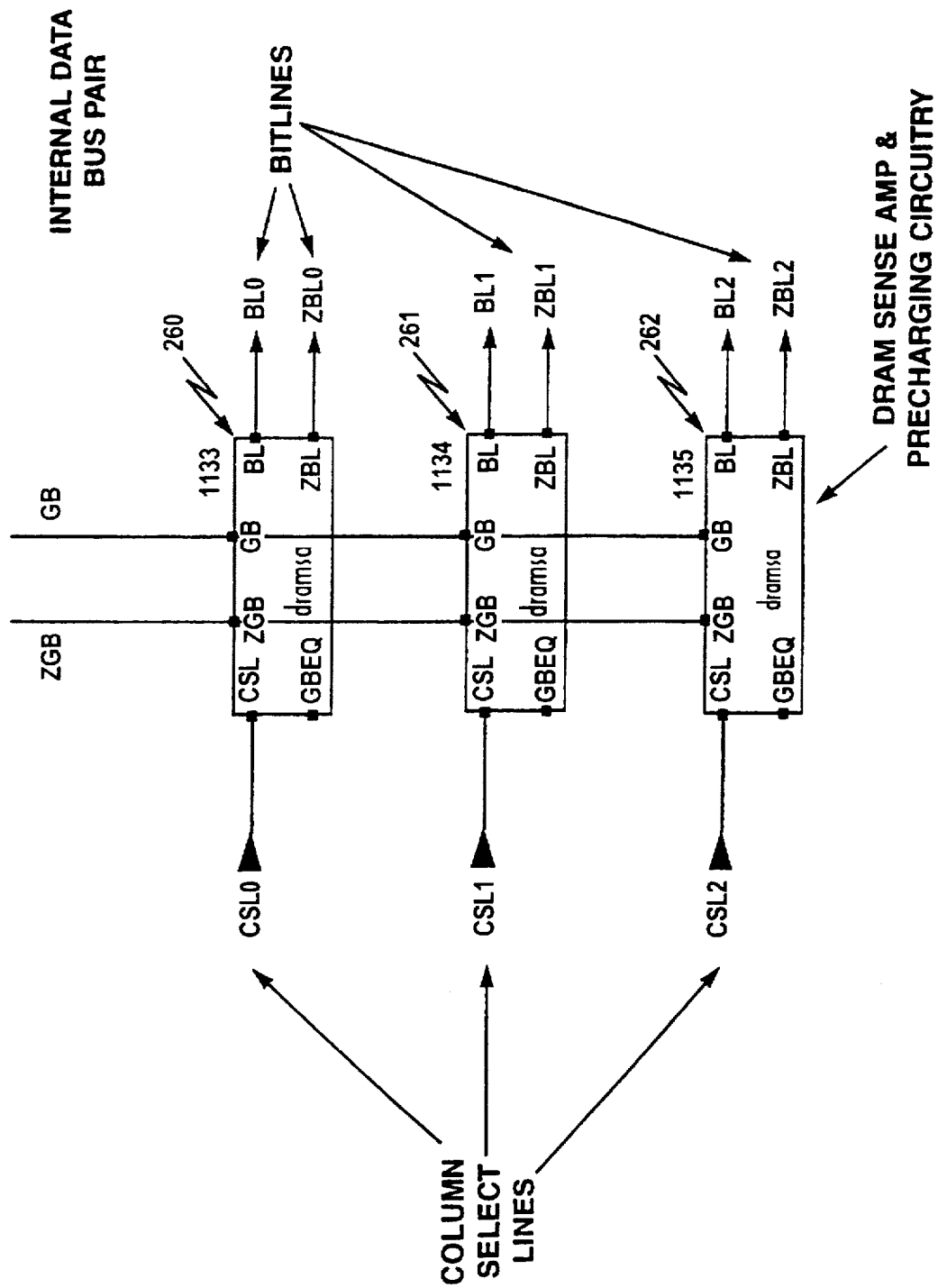
FIG. 2B is a diagram showing how the output of FIG. 2A is used in a memory array.

In FIG. 2B, portions of a DRAM array are shown comprising DRAM sense amplifiers 260, 261 and 262. As illustrated there, the ZGB and GE lines from the write driver 240 of FIG. 2A are connected to respective ports on the sense amplifiers. Column select lines CSL0, CSL1 and CSL2 are connected to respective column select line inputs on the sense amps. Similarly, bit lines BL0, ZBL0, BL1, ZBL1, BL2 and ZBL2 are connected in pairs to the respective input ports on the sense amps. The bit lines $BL_i$ and $ZBL_i$ are double rail logic pairs.

FIGS. 3A–3H represent a logic timing diagram showing operation of the circuit shown in FIGS. 2A and 2B. The timing sequences show a normal DRAM write operation followed by four DRAM writes in the fast clear or "latched" mode of operation and then a fast clear exit (DFX). Since the operation indicated here is a clear, data signal GBWL remains constant at the default state for the clear. As shown in FIG. 3H and 3A, when a normal DRAM write occurs, the bus is precharged and then the GB and ZGB lines split reflecting the data value to be written and then the bus is precharged a second time in preparation for the next write. However, when the fast clear mode is entered, the FCE signal goes high and the ZFCE signal goes low as shown in FIGS. 3D and 3E, respectively. This is a result of latch 250 shown in FIG. 2A. As shown in FIG. 3H, the precharge occurs only once before the fast clear mode DRAM write cycles shown in FIG. 3A above the data enable pulses BT. When the fast clear exit occurs, as shown in FIG. 3A, the internal latch 200 is reset and normal precharge begins occurring prior to the next normal DRAM write cycle shown at the end of FIG. 3A. Thus, when the first fast clear command (DFC) is issued, the latch enable signal, FCE is set high and remains then until the latch is reset. The internal data bus pair (GB, ZGB) remains separated and held at their last values. When the DFX command is issued, the latch is reset and the internal bus is then precharged to its precharged value.

FIG. 4A–4F are logic timing diagrams showing operation of the circuit shown in FIG. 2 when the write data switches from low to high during latched operation. If this condition occurs, as shown in the figures, the internal data bus will switch without precharging. FIGS. 4A–4F correspond to the same lines in FIG. 3. However, at FIG. 4G, the data line GBWL switches from low to high and then back to low again during the time that the fast clear operation is latched. As shown, signal GBWL switches from high to low during the time that signals FCE and ZFCE are high and low, respectively and latched that way. Considering FIG. 4H, the precharge both before and after the normal DRAM write are shown prior to entering the latched state. Once the internal data bus is latched, when the data line GBWL switches from high to low after the latching has occurred, the latch 250 will switch and the internal bus will switch without precharging as shown at point 410 in FIG. 4H. Thus, the data written can change state during operation of the latched condition.

Figure 5:
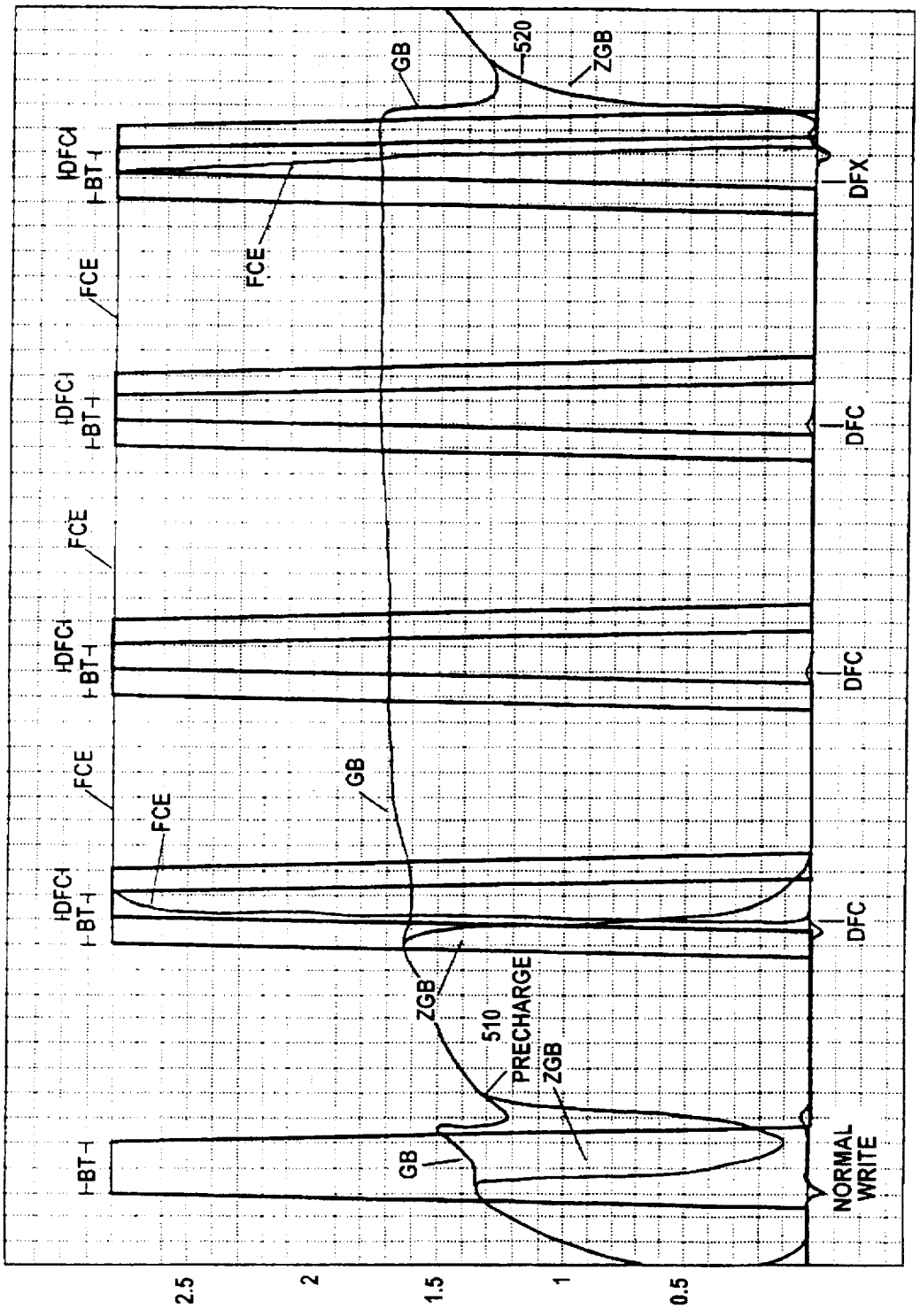
FIG. 5 is a timing diagram showing a precharge during a normal write, followed by execution of three fast clear commands and a fast clear exit.

FIG. 5 is a timing diagram showing a precharge executed prior to execution of three fast clear commands followed by a fast clear exit. Essentially, FIG. 5 shows the superposition of lines BT, ZGB, GB, DFC, /DFX (not DFX) and /FCE (not FCE). As illustrated, precharges occur at points 510 after the normal write command and again at 520 after the fast clear exit (DFX) command.

Figure 6:
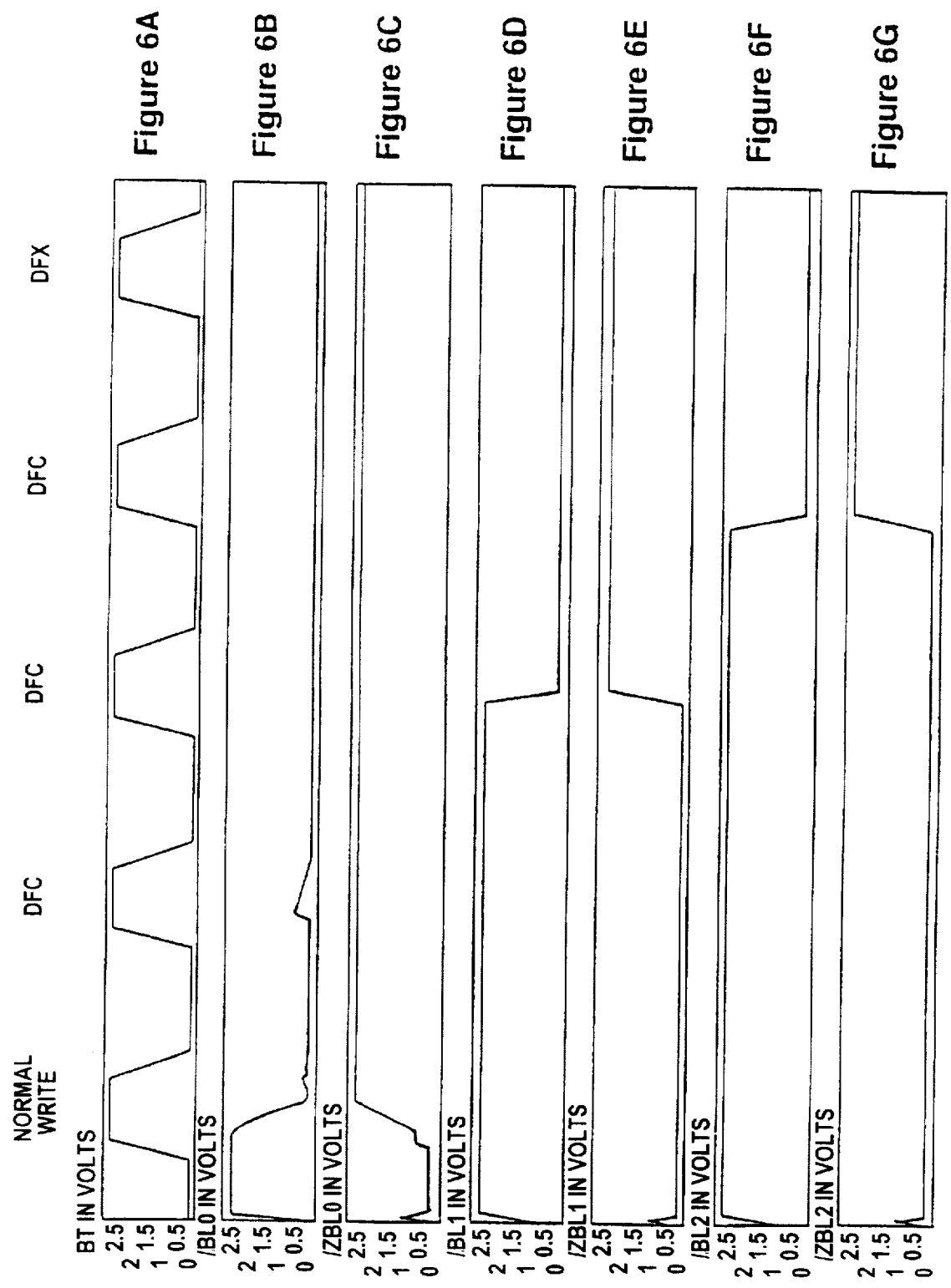
FIG. 6A–6G are set of timing lines showing bit line control signals for three fast clears followed by a fast clear exit.

FIGS. 6A–G are a set of timing lines showing bit line control signals for three fast clears followed by a fast clear exit. As shown in FIGS. 6A–6C, during a normal write, bit lines /BL0 and /ZBL0 reflect that a logic 0 has been written in the memory cell of sense amplifier 260 shown in FIG. 2B. When then engaging in sequential clears of the memory cells sensed by DRAM sense amplifiers 260, 261 and 262, sense amplifier 260 is already at 0 but 261 and 262, switch data from logic 1 to logic 0 as indicated by the bit line value /BL1 and /ZBL1 and /BL2 and /ZBL2. These correspond to FIGS. 6D, 6E, 6F and 6G, respectively.

Figure 7:
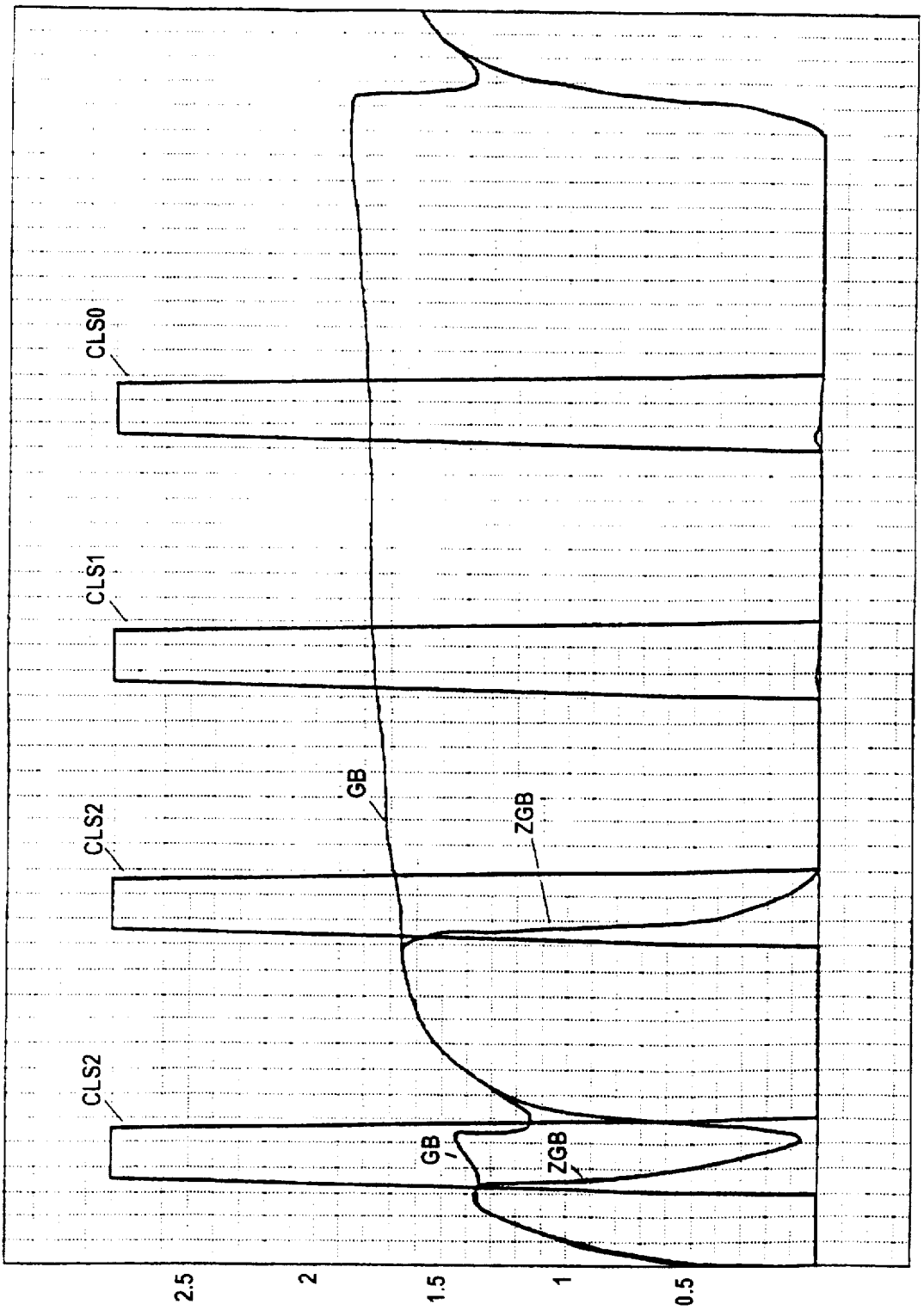
FIG. 7 illustrates a column select control signal for three fast clears.

FIG. 7 illustrates column select control signals for three fast clears. The GB and ZGB lines are shown as before and the appropriate column select pulses are labeled on the drawing.

Figure 8A:
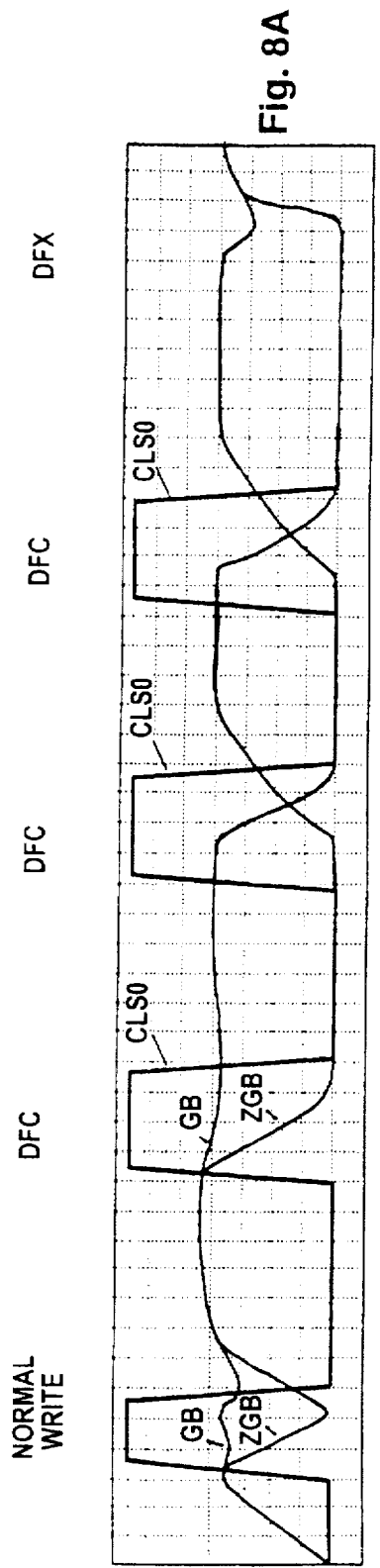
FIGS. 8A–8C show bit line switching (8B) during three fast writes (8A) while latched and the corresponding data and control signals (8C).
Figure 8B:
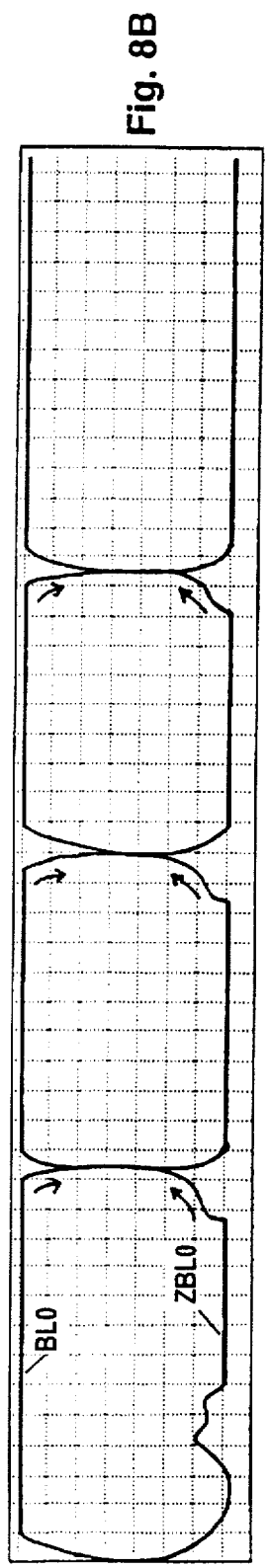
Figure 8C:
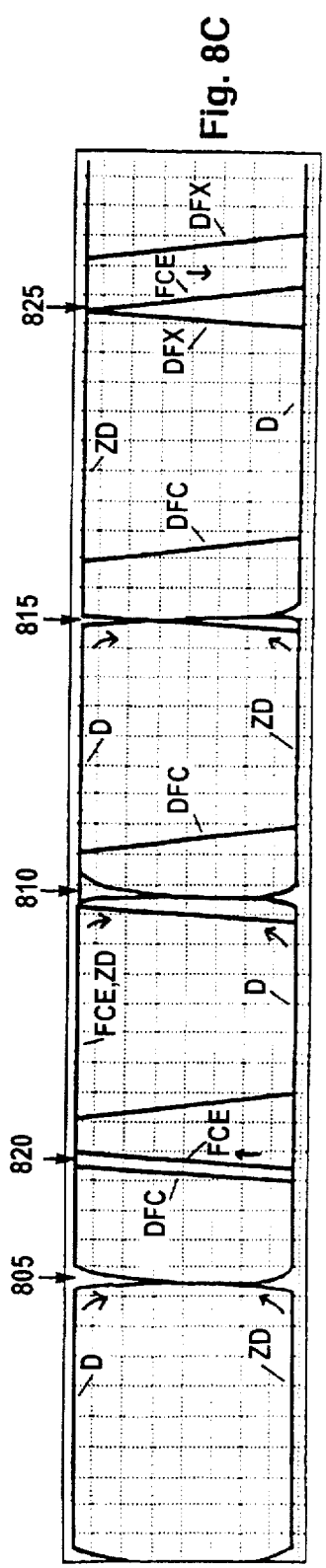

FIGS. 8A–8C show bit line switching (8B) during three fast writes (8A) while latched and the corresponding data and control signals (8C). FIG. 8A is very similar to FIG. 7 discussed above with the exception that the column line select signal shown is only that of CSL0. FIG. 8B shows the bit line switching which occurs in response to data transitions occurring during the latched interval. As shown in FIG. 8C, data transitions occur at points 805, 810 and 815. The DFC intervals are marked at the top of FIG. 8A but refer to the DFC transitions shown in FIG. 8C. Signal FCE transitions from low to high at point 820 and stays up until point 825. The DFX transition, occurring approximately contemporaneously with the FCE down transition at 825, marks the end of the latched state operation.

Figure 9:
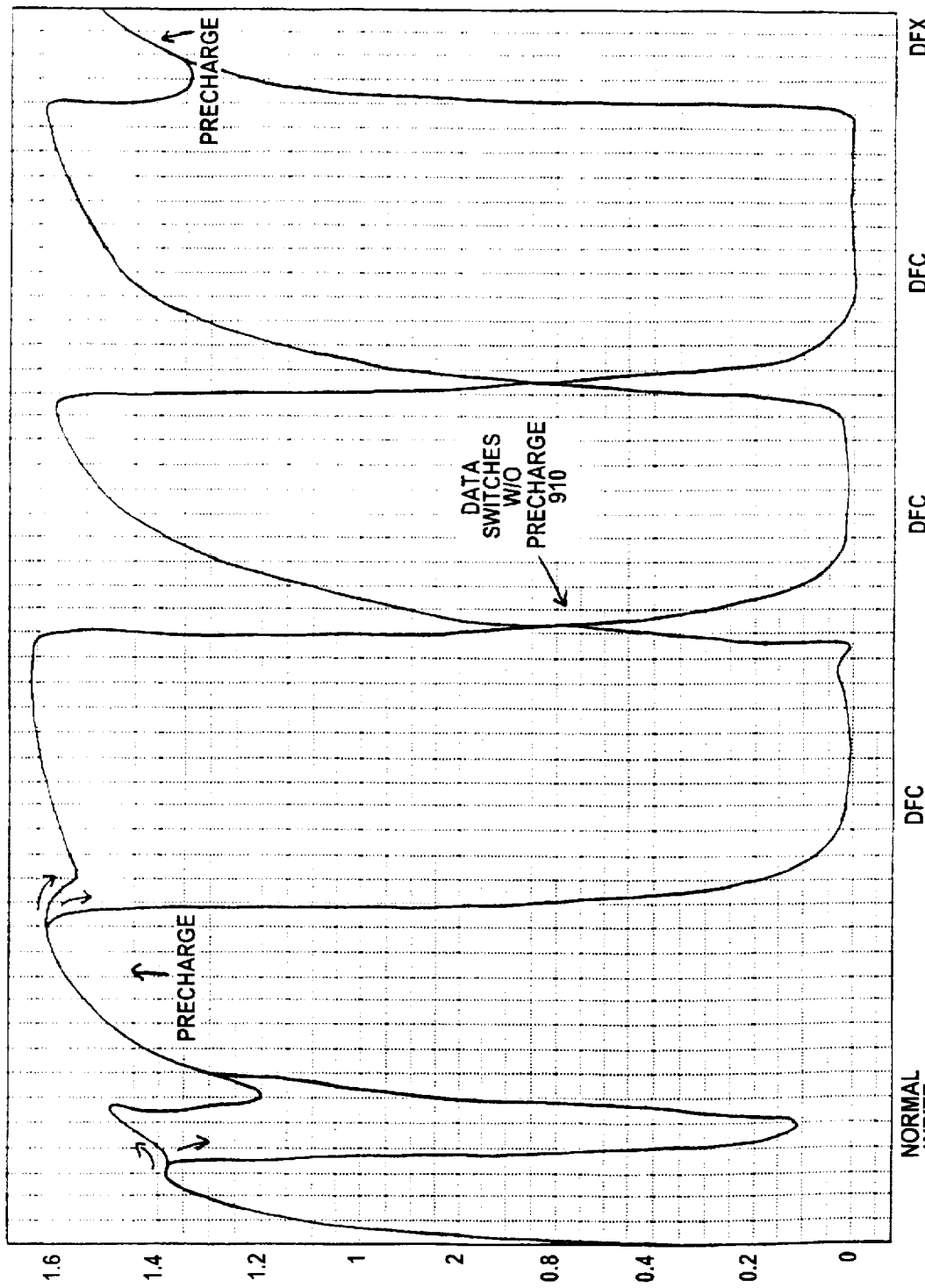
FIG. 9 shows in greater detail the signals of FIG. 8A.

FIG. 9 corresponds substantially to the graph of FIG. 8A, however, it shows it with more resolution, the /GB and /ZGb lines and it shows data switching without a precharge at point 910.

Thus, the timing diagrams explain in greater detail the operation of the circuitry as shown in FIGS. 2A and 2B and the use of the invention to reduce the high power consumption associated with a plurality of repetitive writes to the DRAM and operating at minimum DRAM cycle times. When using the data write bus latching circuit shown in FIGS. 2A and 2B, considerable power savings can be achieved.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

What is claimed is:

1. Apparatus for reducing power consumption during sequential writes to a DRAM array, comprising:
    a. a write driver for writing data to said array; and
    b. a data bus write driver control circuit, having a first latch for latching the data state of an incoming line to a value without precharging, and a second latch activated by a control input for entering a fast data write state.

2. Apparatus of claim 1 in which said first latch is a clocked latch.

3. Apparatus of claim 2 in which said first latch may change state when said line changes state.

4. Apparatus of claim 1 in which said second latch remains activated over a plurality of memory cycles.

5. Apparatus of claim 1 further comprising a second control input for resetting said second latch to resume normal memory write operation.

6. A method of reducing power consumption during sequential writes to a DRAM array, comprising the steps of:
    a. latching the data state of an incoming line to a value, and
    b. writing multiple instances of said value to said DRAM array without precharging between instances.

7. A method of reducing power consumption during sequential writes to a DRAM array, comprising the steps of:
    a. latching the data state of an incoming line to a data value of said line, and
    b. performing multiple writes to said DRAM array of said value without precharging between writes.

* * * * *